United States Patent
Lingampalli

(10) Patent No.: US 6,632,325 B2
(45) Date of Patent: Oct. 14, 2003

(54) ARTICLE FOR USE IN A SEMICONDUCTOR PROCESSING CHAMBER AND METHOD OF FABRICATING SAME

(75) Inventor: Ramkishan Rao Lingampalli, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 14 days.

(21) Appl. No.: 10/072,792

(22) Filed: Feb. 7, 2002

(65) Prior Publication Data

US 2003/0148035 A1 Aug. 7, 2003

(51) Int. Cl.⁷ .................... C23F 1/00; H01L 21/306; C23C 16/00
(52) U.S. Cl. ................ 156/345.51; 118/728; 118/500
(58) Field of Search .......... 156/345.51; 118/728, 118/500

(56) References Cited

U.S. PATENT DOCUMENTS

| | | | |
|---|---|---|---|
| 4,514,250 A | 4/1985 | Hwang | 117/106 |
| 4,783,368 A | 11/1988 | Yamamoto et al. | 428/408 |
| 4,882,203 A | 11/1989 | Witmer | 427/124 |
| 5,192,849 A | 3/1993 | Moslehi | 219/121.43 |
| 5,505,778 A | 4/1996 | Ono et al. | 438/798 |
| 5,581,874 A | * 12/1996 | Aoki et al. | 29/825 |
| 5,796,074 A | 8/1998 | Edelstein et al. | 219/390 |
| 5,811,195 A | 9/1998 | Bercaw et al. | 428/472 |
| 5,835,334 A | * 11/1998 | McMillin et al. | 361/234 |
| 5,925,227 A | 7/1999 | Kobayashi et al. | 204/298.25 |
| 5,981,813 A | * 11/1999 | Cuzzato et al. | 570/166 |
| 6,083,309 A | * 7/2000 | Tomlinson | 106/14.21 |
| 6,139,983 A | 10/2000 | Ohashi et al. | 428/698 |
| 6,175,450 B1 | * 1/2001 | Andreani et al. | 359/586 |
| 6,224,219 B1 | * 5/2001 | Fleming et al. | 359/530 |

FOREIGN PATENT DOCUMENTS

| | | | |
|---|---|---|---|
| EP | 0 460 700 A1 | 12/1991 | C25D/11/18 |
| EP | 0 702 098 A1 | 3/1996 | C23C/16/44 |
| EP | 1 026 281 A2 | 8/2000 | C23C/8/06 |
| JP | 07-273053 | * 10/1995 | C23C/16/22 |

OTHER PUBLICATIONS

International Search Report, dated May 16, 2003 for PCT/US03/02616.

* cited by examiner

Primary Examiner—Jeffrie R. Lund
Assistant Examiner—Rudy Zervigon
(74) Attorney, Agent, or Firm—Moser, Patterson & Sheridan

(57) ABSTRACT

An article having a protective coating for use in semiconductor applications and method for making the same is provided. In one embodiment, a method of coating an aluminum surface of an article utilized in a semiconductor deposition chamber includes the steps of heating a coating material to a semi-liquidous state, the coating material comprising at least one material from the group consisting of aluminum fluoride and magnesium fluoride and depositing the heated coating material on the aluminum surface. The protective coating has a beta phase grain orientation of less than about 10 percent that has good adhesion to aluminum and resists cracking, flaking and peeling. Some articles that may be advantageously coated include showerheads, blocker plates, support assemblies and vacuum chamber bodies, among others.

10 Claims, 5 Drawing Sheets

ARTICLE FOR USE IN A SEMICONDUCTOR PROCESSING CHAMBER AND METHOD OF FABRICATING SAME

FIELD OF THE INVENTION

Embodiments of the invention generally relate to an article having a protective coating for use in a semiconductor processing chamber and a method of making the same.

BACKGROUND OF THE INVENTION

Integrated circuits have evolved into complex devices that can include millions of transistors, capacitors and resistors on a single chip. The evolution of chip designs continually requires faster circuitry and greater circuit density that demand increasingly precise fabrication techniques and processes. One fabrication process frequently used is chemical vapor deposition (CVD).

Chemical vapor deposition is generally employed to deposit a thin film on a substrate or a semiconductor wafer. Chemical vapor deposition is generally accomplished by introducing a precursor gas into a vacuum chamber. The precursor gas is typically directed through a showerhead situated near the top of the chamber. The precursor gas reacts to form a layer of material on the surface of the substrate that is positioned on a heated substrate support typically fabricated from aluminum. Purge gas is routed through holes in the support to the edge of the substrate to prevent deposition at the substrate's edge that may cause the substrate to adhere to the support. Deposition by-products produced during the reaction are pumped from the chamber through an exhaust system. One material frequently formed on substrates using a chemical vapor deposition process is tungsten. A precursor gas that may be used to form tungsten generally includes tungsten hexafluoride ($WF_6$) and silane. As the silane and tungsten hexafluoride mix, some "stray" tungsten (i.e., tungsten that does not deposit on the substrate) deposits on the showerhead and other chamber components. The stray tungsten film builds on the showerhead and may become a source of contamination in the chamber. Eventually, the stray tungsten may clog the holes in the showerhead that facilitate passage of the precursor gas therethrough and necessitating the showerhead be removed and cleaned or replaced.

To extend the interval of time between routine maintenance of the showerhead, fluorine-based chemistries are generally used to clean (i.e., etch away) the stray tungsten film. However, the use of fluorine, while advantageous for removing tungsten, reacts to form a layer of aluminum fluoride on the heated support and other surfaces that are made of aluminum, a material commonly used in CVD chambers. The aluminum fluoride layer formed in this manner has a generally rough surface topography. The rough surface of an aluminum fluoride layer on the heated aluminum support creates a leak path that impairs the vacuum used to chuck or hold the substrate to the heated support. Additionally, the aluminum fluoride layer often cracks and peels over the course of thermal cycling of the heated support, and thus becomes a source of particulate contamination.

One solution to the formation of aluminum fluoride on heated aluminum supports is to fabricate the heater from ceramic materials that are resistant to fluorine. However, ceramic supports are difficult to fabricate and, consequently, are very costly as compared to conventional aluminum heaters used in CVD processes.

Another way to prevent fluorine reaction with the aluminum support is to deposit an aluminum fluoride barrier layer on the support. However, conventional methods of applying aluminum fluoride to the support result in aluminum fluoride barrier layers having about 20 to about 30 percent of the grain structure in the beta phase and about 70 to about 80 percent of the grain structure in the alpha phase. Aluminum fluoride layers having greater than about 10 percent of the grain structure in the beta phase do not adhere well to aluminum and are also prone to cracking. As the aluminum fluoride barrier layer cracks, fluorine, reacting with the underlying aluminum, causes additional growth of aluminum fluoride under the layer, eventually causing the barrier layer of aluminum fluoride to separate from the support. Flakes of aluminum fluoride from the peeled barrier layer are a source of particulate contamination which is detrimental to process yields. Other aluminum surfaces within the processing chamber have similar problems.

Therefore, there is a need for coating that protects aluminum surfaces in semiconductor processing chambers.

SUMMARY OF THE INVENTION

An article having a protective coating for use in semiconductor applications and method for making the same is provided. In one aspect, an article for use in a semiconductor processing chamber includes a coating comprising an aluminum fluoride or a magnesium fluoride layer applied in a semi-liquid, semi-solid state to the aluminum surface of a chamber component.

In another aspect, a substrate support is provided having a protective coating. In one embodiment, the substrate support includes a support body having a heating element disposed therein. A coating comprising an aluminum fluoride or magnesium fluoride layer is applied to an aluminum surface of the support body in a semi-liquid, semi-solid state.

In another aspect, a method of coating an aluminum surface of an article utilized in a semiconductor deposition chamber is provided. In one embodiment, a method of coating an aluminum surface of an article utilized in a semiconductor deposition chamber includes the steps of heating a coating material to a semi-liquid, semi-solid state, the coating material comprising at least one material from the group consisting of aluminum fluoride and magnesium fluoride and depositing the heated coating material on the aluminum surface. The protective coating has a beta phase grain orientation of less than about 10 percent that provides good adhesion to aluminum and resists cracking, flaking and peeling. Some articles that may be advantageously coated using this method include showerheads, blocker plates, support assemblies and vacuum chamber bodies among others.

In another aspect, a method of coating an aluminum surface on a substrate support includes the steps of forming a plasma from an inert gas, heating aluminum fluoride with the plasma, and spraying the heated aluminum fluoride on the aluminum surface.

BRIEF DESCRIPTION OF THE DRAWINGS

A more particular description of the invention, briefly summarized above, may be had by reference to the embodiments thereof which are illustrated in the appended drawings. It is to be noted, however, that the appended drawings illustrate only typical embodiments of the invention and are, therefore, not to be considered limiting in its scope, for the invention may admit to other equally effective embodiments.

To facilitate understanding, identical reference numerals have been used, where possible, to designate identical elements that are common to the figures.

DETAILED DESCRIPTION OF THE PREFERRED EMBODIMENT

The present invention generally provides a processing system having coated aluminum surfaces that is advantageous for the deposition of tungsten and other films. The invention is illustratively described below as a chemical vapor deposition system, such as a WxZ™ metal chemical vapor deposition (MCVD) system, available from Applied Materials, Inc. of Santa Clara, Calif. However, it should be understood that while the invention has particular utility for protecting aluminum surfaces of substrate supports against reactions with fluorine and fluorine comprising fluids, the invention is contemplated for use on substrate supports utilized on other deposition systems, etch systems and other surfaces within semiconductor processing chambers. It should be noted that the term aluminum used herein is intended to include aluminum and its alloys.

Figure 1:
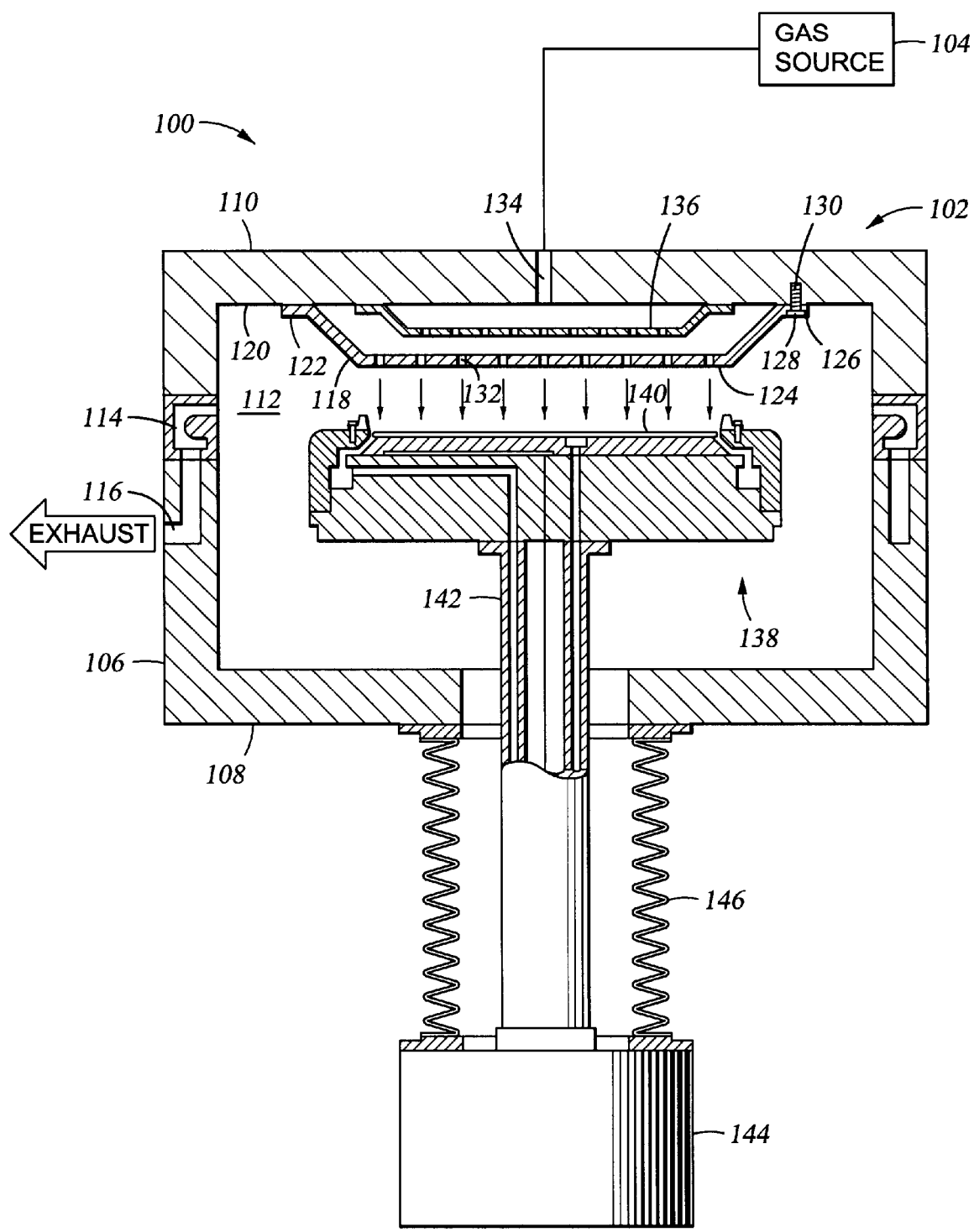
FIG. 1 depicts a schematic, sectional view of one embodiment of a processing chamber having a heater assembly disposed therein.

FIG. 1 is a cross-sectional view of one embodiment of a chemical vapor deposition system 100. The system 100 generally includes a chamber 102 coupled to a gas source 104. The chamber 102 has walls 106, a bottom 108 and a lid 110 that define a process volume 112. The walls 106 and bottom 108 are typically fabricated from a unitary block of aluminum. The chamber 102 contains a pumping ring 114 that couples the process volume 112 to an exhaust port 116. The exhaust port 116 is coupled to various pumping components (not shown) that exhaust and control the pressure within the process volume 112.

The lid 110 is supported by the walls 106 and can be removed to service the chamber 102. The lid 110 is generally comprised of aluminum and may additionally contain heat transfer fluid channels for regulating the temperature of the lid 110 by flowing a heat transfer fluid therethrough.

A showerhead 118 is coupled to an interior side 120 of the lid 110. The showerhead 118 is typically fabricated from aluminum. The showerhead 118 generally includes a perimeter mounting ring 122 that surrounds a "dish-shaped" center section 124. The mounting ring 122 includes a plurality of mounting holes 126 that pass therethrough, each accepting a vented mounting screw 128 that threads into a mating hole 130 in the lid 110. The center section 124 includes a perforated area 132 that facilitates passage of gases therethrough.

A mixing block 134 is disposed in the lid 110. The mixing block 134 is coupled to the gas source 104, such that process and other gases may be introduced to the process volume 112 by passing through the mixing block 134 and showerhead 118. Typically, cleaning gases from a cleaning source (not shown) are also introduced through the mixing block 134 to the process volume 112. A perforated blocker plate 136 is disposed between the showerhead 118 and mixing block 134 to enhance the uniform distribution of gases passing through the showerhead 118 and into the chamber 102. The blocker plate 136 is typically fabricated from aluminum.

An at least partially coated support assembly 138 is disposed beneath the showerhead 118. The support assembly 138 includes a shaft 142 coupled thereto and supports a substrate 140 during processing. The support assembly is typically accessed by the substrate 140 through a port (not shown) in the walls 106. A shaft 142 is coupled between the support assembly 138 and a lift mechanism 144. The lift mechanism 144 moves the support assembly 138 between an elevated position as shown and a lowered position. A bellows 146 disposed between the support assembly 138 or shaft 142 and the chamber bottom 108 provides a vacuum seal between the process volume 112 and the atmosphere outside the chamber 102 while facilitating movement of the support assembly 138. Lift pins and associated mechanisms have been omitted for clarity.

In operation, the semiconductor substrate 140 is secured to the support assembly 138 by providing a vacuum therebetween. The temperature of the substrate is elevated to a pre-determined process temperature by regulating thermal transfer to the support assembly by a heating element described below. During the deposition process, the substrate is heated to a steady temperature, typically between 300° C. and 550° C.

Gaseous components, which in one embodiment may include silane and tungsten hexafluoride, are supplied from a gas panel to the process chamber through the mixing block 134 and showerhead 118 to form a gaseous mixture. The gaseous mixture reacts to form a layer of tungsten on the substrate 140. To prevent deposition at the substrate's edge and possible adherence of the substrate 140 to the support assembly 138, purge gases flow from the support assembly 138 around the perimeter of the substrate 140.

Figure 2:
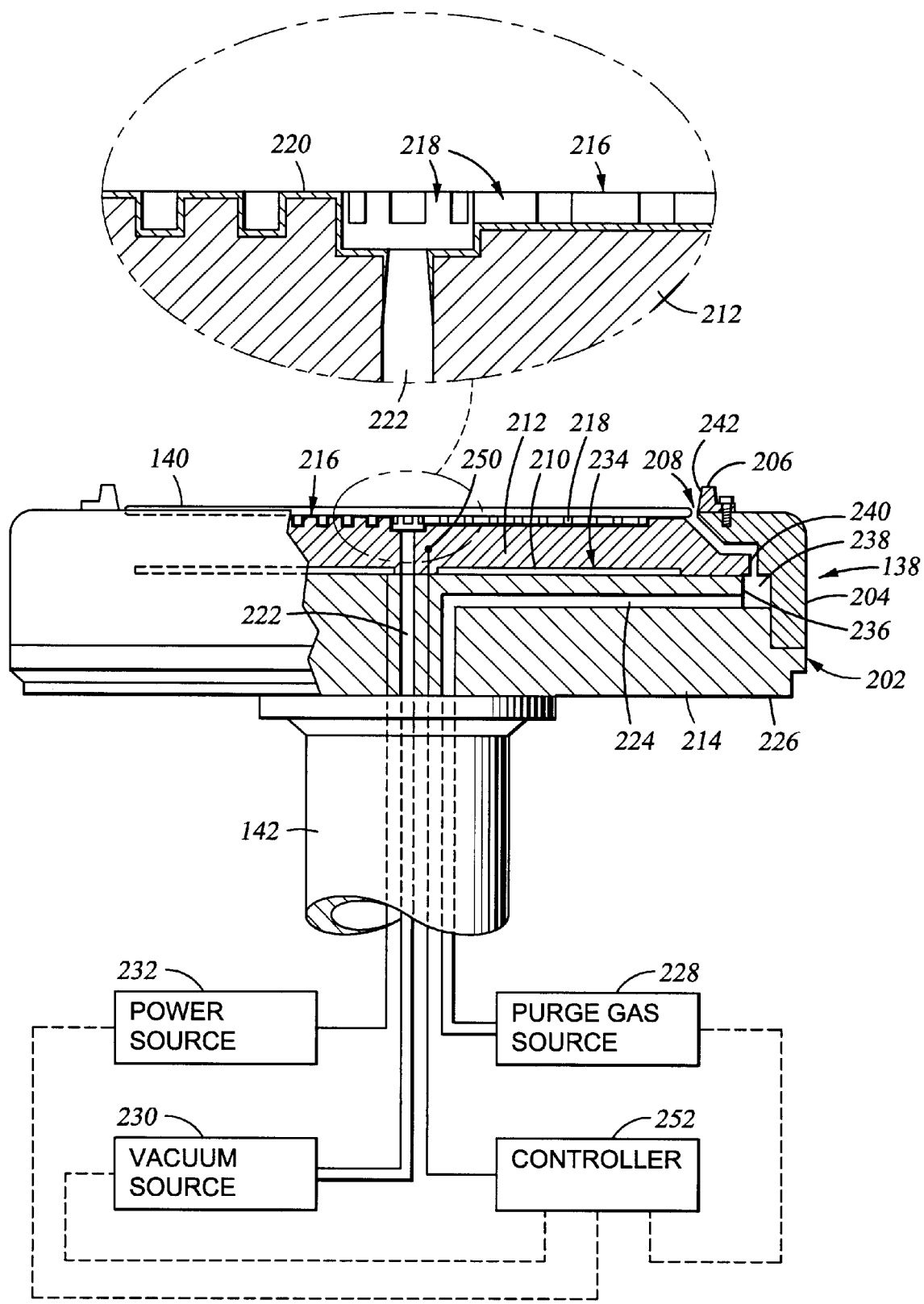
FIG. 2 depicts a partial sectional view of one embodiment of the heater assembly depicted in FIG. 1.

FIG. 2 depicts the support assembly 138 in cross-section. The support assembly 138 is generally comprised of aluminum. A heating element 234 is typically embedded or coupled to the support assembly 138. The heating element 234 may be any number of devices or component that facilitates heat transfer with the support assembly 138, for example, thermoelectric devices, resistive heaters and conduits for flowing heat transfer fluid, among others.

In the embodiment depicted in FIG. 2, the support assembly 138 includes an upper portion 212 and a lower portion 214 having a heating element 234 in the form of an resistive element 210 disposed therebetween. The upper and lower portions 212, 214 are coupled by clamping, fastening, welding, brazing and adhering, among other methods. The resistive element 210 is typically fabricated from a conductive material. A power source 232 is coupled to the resistive element 210. A thermocouple 250 is disposed in the support assembly 138 and is coupled to a controller 252. The controller 252, in response to information provided by the thermocouple 250, controls the power applied to the resistive element 210 from the power source 232 to controllably heat the support assembly 138 and substrate seated thereon to a predetermined temperature.

Figure 3:
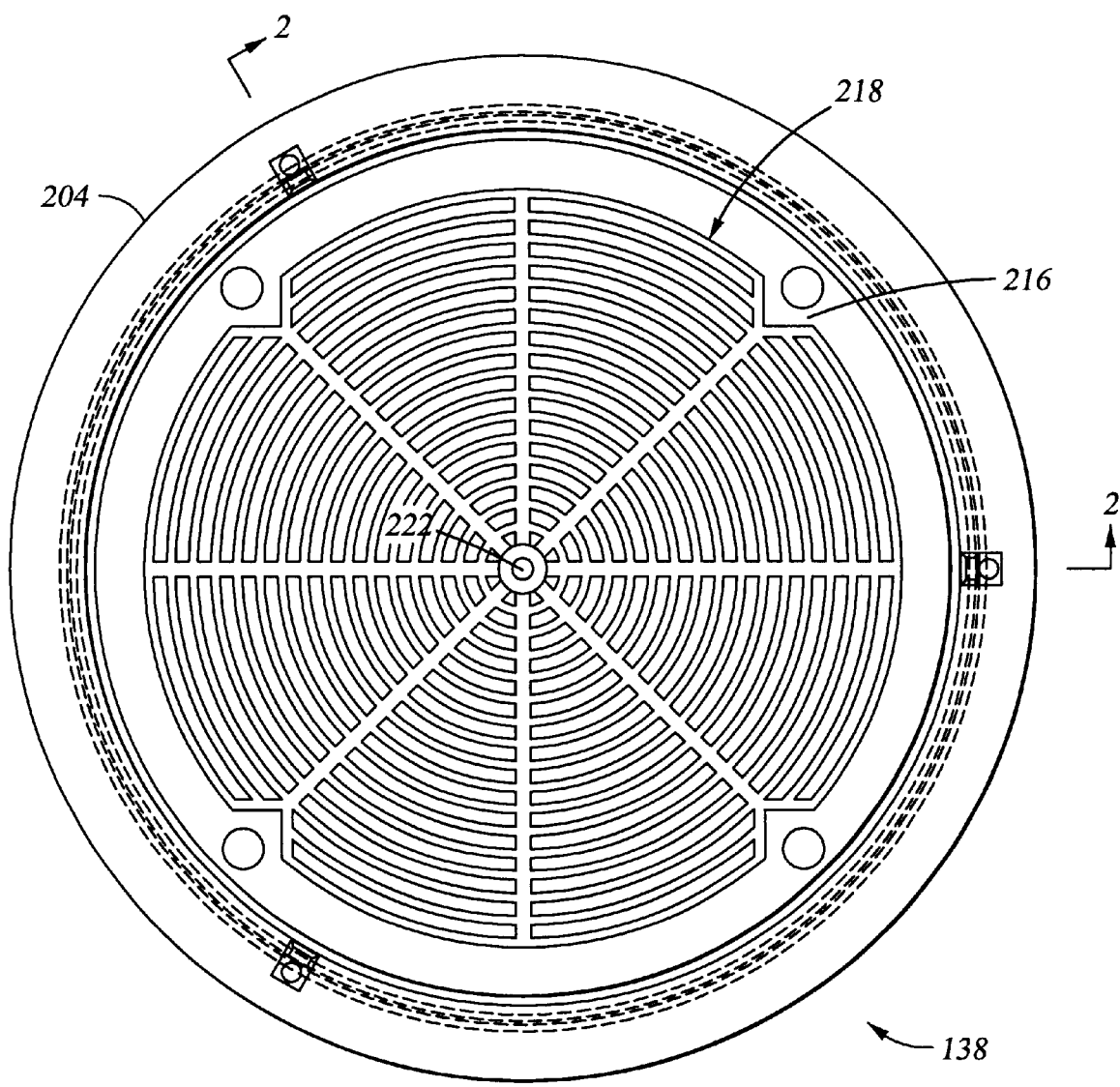
FIG. 3 depicts a top view of the heater assembly depicted in FIG. 2.

As depicted in FIGS. 2 and 3, a vacuum passage 222 is disposed through the support assembly 138, coupling a support surface 216 that supports the substrate 140 to a vacuum source 230. The support surface 216 may include one or more channels 218 disposed therein and coupled to the vacuum passage 222 to uniformly distribute the vacuum applied between the support assembly 138 and the substrate 140.

Returning to FIG. 2, a purge passage 224 is disposed through the support assembly 138. The purge passage 224 is generally disposed between a lower surface 226 of the lower portion 214 and a side 236 of the support assembly 138. A purge ring 204 is coupled to the support assembly 138 and defines an annular plenum 238 therebetween. The purge ring 204 is typically fabricated from a material similar or identical to the support assembly 138, but may alternatively be fabricated from other materials. Purge gas flowing from the purge passage 224 is uniformly distributed in the plenum 238 around the side 236 of the support assembly 138. One or more purge channels fluidly couple the plenum 238 to the support surface 216 at the circumference of the substrate 140. In the embodiment depicted in FIG. 2, an annular purge channel 208 is formed between the purge ring 204 and support assembly 138. Typically, a restrictor 240 is disposed in the flow path between the plenum 238 and purge channel 208 to enhance uniform distribution of gas within the plenum 238. The purge channel 208 provides purge gas uniformly around the substrate 140 and prevents edge deposition that may adhere the substrate to the support surface 216.

A plurality of alignment pins 206 are typically coupled to the support surface 216 and/or purge ring 204. The alignment pins 206 may alternatively be an integral part of the purge ring 204. The alignment pins 206 generally have a sloped face 242 that centers the substrate 140 on the support assembly 138.

A protective coating 220 is typically disposed on at least the upper surface 216 of the support assembly 138. The coating 220 is typically applied to the upper surface 216 before the purge ring 204 is attached and may additionally cover the side 336, lower surface 226 and other portions of the support assembly 138 exposed prior to final assembly (i.e., portions of the purge channel 208, restrictor 240 and plenum 238). The coating 220 may additionally be applied to the purge ring 204 and/or alignment pins 206, either individually, as an assembly. Optionally, the coating 220 may be applied to other aluminum surfaces within the chamber 102. For examples chamber itself, the showerheads (including gas distribution plates and faceplates), blocker plate among others.

Generally, the coating 220 typically comprises a layer of aluminum fluoride ($AlF_3$), magnesium fluoride ($MgF_2$) or other material that prevents penetration of fluoride and/or fluoride containing compounds therethrough. The coating thickness is sufficient to prevent such penetration and is typically between about 12 to 25 $\mu$m for $AlF_3$ and $MgF_2$ coatings. The coating 220 comprised of $AlF_3$ generally has a grain structure comprising less than about 6 percent in the beta phase. In one embodiment, the coating has a grain structure comprising less than about 10 percent in the beta phase. The coating typically has an alpha phase grain structure of greater than about 90 percent. The low percentage of grain structure in the beta phase improves adhesion of the coating to the support assembly 138 thereby substantially reducing flaking, peeling and particulate generation associated with conventional coatings having a higher percentage of beta phase grain orientation.

Figure 4:
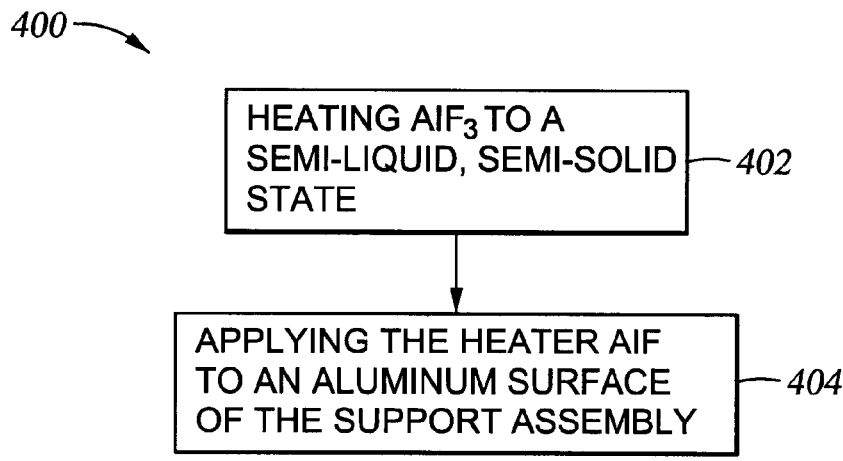
FIG. 4 depicts a flow diagram of one embodiment of a method of fabricating a heater assembly.

The coating 220 may be applied through a number of thermal methods wherein $AlF_3$ or other coating material is heated to about a semi-liquid, semi-solid state. For example, FIG. 4 depicts one embodiment of a method 400 for applying an $AlF_3$ coating to a substrate support having an aluminum surface. The method 400 begins at step 402 by heating aluminum fluoride to about a semi-liquid, semi-solid state. Then, at step 404, the heated aluminum fluoride is applied to the aluminum surface of the support assembly 138. The applied aluminum fluoride generally forms a layer of material that has less than about 6 percent of the grain structure in the beta phase. In another embodiment, the grain structure of the applied aluminum fluoride is less than about 10 percent in the beta phase. The applied aluminum fluoride having less than about 10 percent of its grain structure in the beta phase has shown good adhesion to aluminum while aluminum fluoride having less than about 8 percent of its grain structure in the beta phase has shown excellent adhesion to aluminum and resistance to cracking and peeling, particularly when utilized in processing equipment operated in a temperature range of between about 425 to about 480 degrees Celsius. Moreover, the resulting surface finish of the coating applied by this process is generally less than or equal to about 24 RA, which minimizes scratching or particular generation of the substrate when seated thereon during processing. Optionally, a grinding or polishing step may be employed to improve the surface finish of the coating 220. Generally, if a grinding or polishing step is employed, the thickness of the coating 220 should not be reduced to less than about 12 $\mu$m thick.

The heating step 402 may be accomplished by exposing $AlF_3$ in powder form to a plasma formed from an inert gas. The plasma may be formed in a chamber where the applying step 404 occurs or may be remotely generated. Typically, argon, neon and/or helium may be utilized to form the plasma. In one embodiment, the temperature of the plasma is about 1450 to about 1600 degrees Celsius.

The grain size of the $AlF_3$ powder used in the plasma heated deposition process is typically in the range of about +100 to –325 mesh. In one embodiment, the $AlF_3$ powder generally has a grain orientation of at least about 90 percent in the alpha phase. Step 404 of applying the heated $AlF_3$ to the support assembly 138 is generally accomplished by spraying the heated $AlF_3$ onto the support surface 216 that is typically at room temperature. The sprayed $AlF_3$ reaches the support surface 216 in a semi-solid, semi-liquid state. The support assembly 138 having the coating 220 disposed thereon is then cooled at room temperature.

Figure 5:
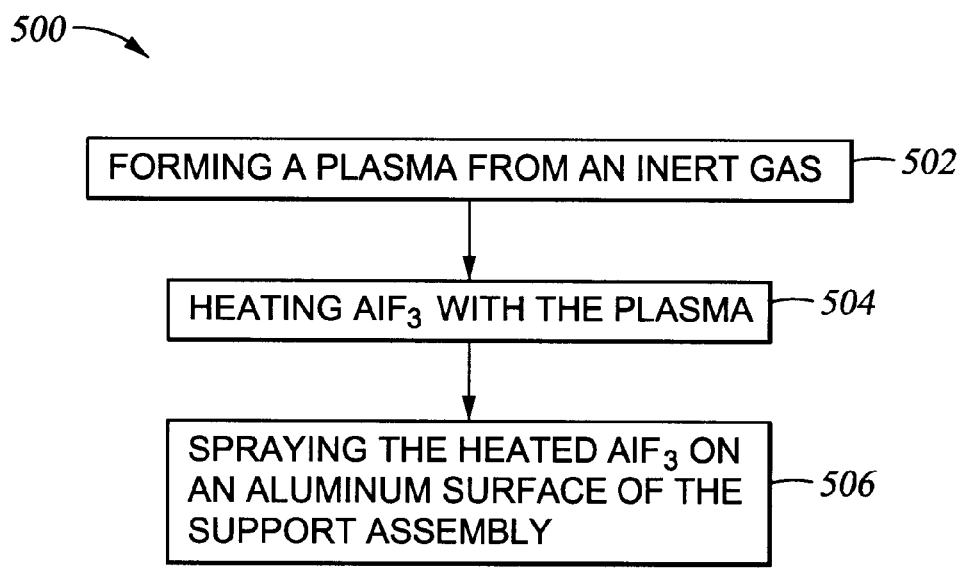
FIG. 5 depicts a flow diagram of another embodiment of a method of fabricating a heater assembly.

FIG. 5 depicts another embodiment of a method for fabricating a substrate support. The method 500 generally begins at step 502 by forming a plasma from an inert gas. At step 504, $AlF_3$ is heated with the plasma. At step 506, the heated $AlF_3$ is sprayed on the support surface 216 of the support assembly 138. In one embodiment, $AlF_3$ is sprayed through the plasma onto the support surface 216.

Although two examples have been illustrated for heating $AlF_3$ to a semi-liquid, semi-solid state before applying the $AlF_3$ to the support assembly 138, other methods of heating $AlF_3$ to a semi-liquid, semi-solid state before or after application to the substrate support 138 may exist or be developed that produce the coating 220 having a grain orientation of less than about 10 percent in the beta phase and accordingly are contemplated within the scope of the invention. Additionally, the methods 400 and 500 may be adapted to apply $MgF_2$ or other material that prevents penetration of fluoride and/or fluoride containing compounds therethrough.

Figure 6:
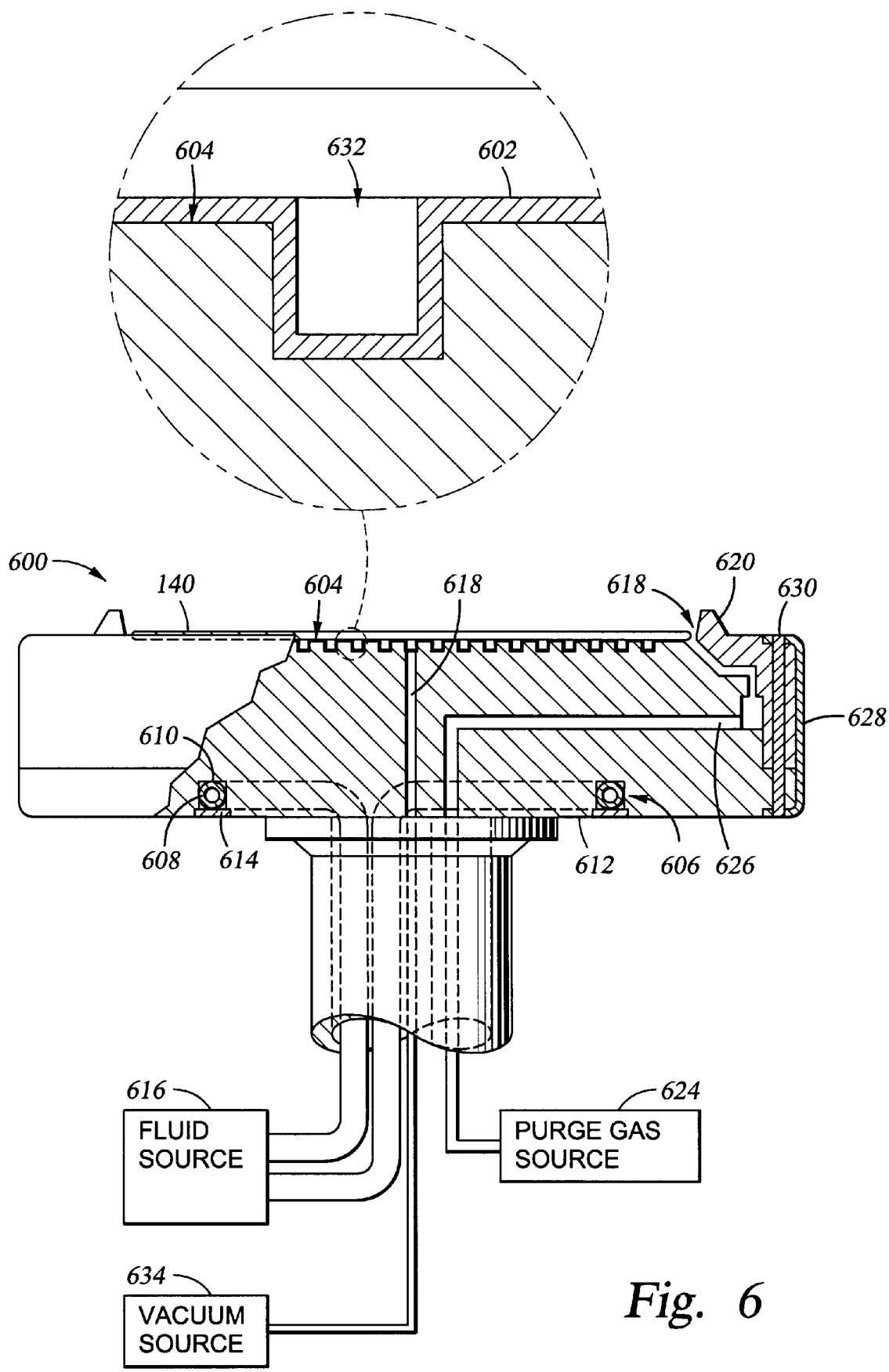
FIG. 6 depicts a partial sectional view of another embodiment of a heater assembly.

FIG. 6 depicts another support assembly 600 having a protective coating 602 disposed at least on a support surface 604 of the support assembly 600. The support assembly 600 is generally fabricated from aluminum and has a heater element 606 embedded therein. In the embodiment depicted in FIG. 6, the heater element 606 is a conduit 608 disposed in a groove 610 formed in a lower surface 612 of the support assembly 600. The groove 610 has a plug 614 coupled thereto that encloses the conduit 608 in the groove 610.

The conduit 608 is coupled to a heat transfer fluid source 616. The heat transfer fluid source 616 flows heat transfer fluid through the conduit 608 to thermally regulate the substrate 140 seated on the support surface 604.

A vacuum passage 618 is disposed through the support assembly 600 similar to the passage 222 described above with reference to FIG. 2. A vacuum source 634 is coupled to the vacuum passage 618 and allows for a vacuum to be established between the substrate and the support surface 604 to retain the substrate. The support surface 614 may additionally include channels 632 to distribute the vacuum uniformly under the substrate.

A purge ring 620 circumscribes the support surface 604 and forms a purge gas channel 622 with the support assembly 600. The purge gas channel 622 is coupled to a purge gas source 624 by a purge gas passage 626 formed through the support assembly 600. The purge ring 620 is coupled to the support assembly 600 by a clamp 628 and pin 630. Use of a clamp and pin to secure a purge ring to a support assembly is described in greater detail in U.S. Pat. No. 6,223,447, issued May 1, 2001, which is hereby incorporated by reference in its entirety.

The coating 602 is generally disposed on at least the support surface 604 but may be additionally disposed on other portions of the support assembly 600, purge ring 620 and/or clamp 628. The coating 602 is generally identical to the coating 220 described above with reference to FIGS. 2, 4 and 5. The coating is more capable of resisting cracking, flaking and the like when exposed to aggressive materials, such as fluorine, while simultaneously protecting the underlying material on which it rests from attack from the aggressive environment. Thus, the coating enhances the service life of coated surfaces while preventing contamination of substrates during processing.

The coating 602 applied by the method described above has demonstrated resistance to degradation when exposed to harsh environments, for example environments containing $NF_3$. For example, a cleaning cycle in a WxZ™ metal chemical vapor deposition (MCVD) system generally exposes the coating 602 to $NF_3$ for approximately 40 second per cycle. After by subjecting the coating 602 to 360 cleaning cycles, the coating 602 illustrated no signs of deterioration, cracking, flaking or other detrimental condition.

The coating 602 has additionally demonstrated stability under thermal shock conditions. For example, the coating 602 can be rapidly heated to about 475 degrees Celsius. After holding this temperature for about 1.5 hours and allowed to cool at room temperature, no peeling, delamination, cracks or other detrimental condition was evident when examined.

A heater or other chamber component coated as described above is advantageous over a component having conventionally applied $AlF_3$ protective layer. For example, thermal application (e.g., seasoning) of an aluminum heater (substrate supports) costs approximately 10 times as much as applying an $AlF_3$ coating as described above. Moreover, testing has demonstrated that a heater coated as described above has at least comparable longevity as compared to seasoned heaters, lasting upwards of 10,000 deposition cycles, and accordingly may readily replace existing heaters with substantially no impact on substrate throughput.

Although teachings of the present invention that have been shown and described in detail herein, those skilled in the art can readily devise other varied embodiments that still incorporate the teachings and do not depart from the scope and spirit of the invention.

What is claimed is:

1. A substrate support having an aluminum surface coated with aluminum fluoride, said aluminum fluoride coating applied by a method comprising heating aluminum fluoride to a semi-liquidous state and applying the heated aluminum fluoride to the aluminum surface.

2. The substrate support of claim 1, wherein the aluminum fluoride coating is about 12 to 25 $\mu$m thick.

3. The substrate support of claim 1, wherein the aluminum fluoride coating has less than 6 percent beta phase grain structure.

4. A substrate support having an aluminum surface coated with aluminum fluoride, said aluminum fluoride coating applied by a method comprising:

spraying aluminum fluoride powder having a grain orientation of at least 90 percent in the alpha phase through a plasma formed from an inert gas; and depositing the sprayed aluminum fluoride on the aluminum surface, wherein the deposited aluminum fluoride has less than 10 percent beta phase grain structure.

5. The substrate support of claim 4, wherein plasma is at a temperature of between 1450 and 1600 degrees Celsius.

6. The substrate support of claim 4, wherein the deposited aluminum fluoride coating is about 12 to 25 $\mu$m thick.

7. The substrate support of claim 4, wherein the aluminum fluoride coating has a beta phase grain structure of less than 6 percent.

8. A substrate support comprising:

a support body having an aluminum surface;

a heating element disposed in the support body; and a coating comprising an aluminum fluoride or magnesium fluoride layer applied in a semi-liquid, semi-solid state to the aluminum surface.

9. A substrate support comprising:

a support body having an aluminum first surface and an opposing second surface;

a heating element disposed in the support body;

a passage formed through the support body between the first surface ad the second surface, and adapted to evacuate a region between the first surface of the support body and a substrate positioned thereon; and a coating comprising an aluminum fluoride layer applied in a semi-liquid, semi-solid state to the aluminum surface and having less than 10 percent beta phase grain structure.

10. The substrate support of claim 9 further comprising:

at least one purge gas channel formed through the support body between the second surface and a side of the support body.

* * * * *

UNITED STATES PATENT AND TRADEMARK OFFICE
CERTIFICATE OF CORRECTION

PATENT NO. : 6,632,325 B2
DATED : October 14, 2003
INVENTOR(S) : Lingampalli

It is certified that error appears in the above-identified patent and that said Letters Patent is hereby corrected as shown below:

Column 5,
Lines 44, 48-49, 61, 64, please change "AIF$_3$" to -- AlF$_3$ --.

Column 6,
Lines 24, 30, 36-37, 44-45, 49-51, please change "AIF$_3$" to -- AlF$_3$ --.

Column 7,
Lines 55 and 58, please change "AIF$_3$" to -- AlF$_3$ --.

Column 8,
Line 49, please change "ad" to -- and --.

Signed and Sealed this

First Day of June, 2004

JON W. DUDAS
*Acting Director of the United States Patent and Trademark Office*

UNITED STATES PATENT AND TRADEMARK OFFICE
CERTIFICATE OF CORRECTION

| | |
|---|---|
| PATENT NO. | : 6,632,325 B2 |
| APPLICATION NO. | : 10/072792 |
| DATED | : October 14, 2003 |
| INVENTOR(S) | : Lingampalli |

It is certified that error appears in the above-identified patent and that said Letters Patent is hereby corrected as shown below:

Claim 1, column 8, line 10, cancel the text beginning with "1. A substrate support" to and ending "to the aluminum surface." in column 8, line 14, and insert the following claim:

1. A substrate support having an aluminum surface coated with aluminum fluoride having less than 10 percent beta phase grain structure, said aluminum fluoride coating applied by a method comprising heating aluminum fluoride to a semi-liquidous state and applying the heated aluminum fluoride to the aluminum surface.

Claim 8, column 8, line 37, cancel the text beginning with "8. A substrate support comprising:" to and ending "to the aluminum surface." in column 8, line 42, and insert the following claim:

8. A substrate support comprising: a support body having an aluminum surface; a heating element disposed in the support body; and a coating comprising an aluminum fluoride layer applied to the aluminum surface having less than 10 percent beta phase grain structure.

Signed and Sealed this

Twenty-second Day of August, 2006

JON W. DUDAS
*Director of the United States Patent and Trademark Office*